(12) United States Patent
Hrubes (10) Patent No.: US 7,808,314 B2
(45) Date of Patent: Oct. 5, 2010

(54) CIRCUIT FOR ADJUSTING AN IMPEDANCE

(75) Inventor: Franz Hrubes, Rothalmunster (DE)

(73) Assignee: Micro-Epsilon Messtechnik GmbH & Co. KG, Ortenburb (DE)

( * ) Notice: Subject to any disclaimer, the term of this patent is extended or adjusted under 35 U.S.C. 154(b) by 113 days.

(21) Appl. No.: 12/162,758

(22) PCT Filed: Jan. 10, 2007

(86) PCT No.: PCT/DE2007/000046

§ 371 (c)(1),
(2), (4) Date: Jul. 30, 2008

(87) PCT Pub. No.: WO2007/087774

PCT Pub. Date: Aug. 9, 2007

(65) Prior Publication Data

US 2009/0009245 A1 Jan. 8, 2009

(30) Foreign Application Priority Data

Jan. 31, 2006 (DE) ........................ 10 2006 004 624
Sep. 22, 2006 (DE) ........................ 10 2006 045 279

(51) Int. Cl.
*H03G 3/20* (2006.01)
(52) U.S. Cl. .................... 330/144; 330/260; 330/254
(58) Field of Classification Search ................. 330/144, 330/260, 254
See application file for complete search history.

(56) References Cited

U.S. PATENT DOCUMENTS

| 4,039,981 A | | 8/1977 | Ohashi et al. | |
|---|---|---|---|---|
| 4,178,482 A | * | 12/1979 | Ouellette | .................... 370/201 |
| 4,350,964 A | | 9/1982 | Chambers, Jr. | |
| 5,245,229 A | * | 9/1993 | Colvin, Sr. | ................... 327/361 |
| 5,420,507 A | | 5/1995 | Laskowski | |
| 5,485,115 A | | 1/1996 | Nordeng | |
| 5,523,721 A | * | 6/1996 | Segawa et al. | ................. 330/86 |
| 5,886,580 A | * | 3/1999 | Ikeda et al. | ................. 330/293 |
| 6,034,566 A | * | 3/2000 | Ohe | ........................... 330/69 |

(Continued)

FOREIGN PATENT DOCUMENTS

DE  2332836  1/1975

(Continued)

OTHER PUBLICATIONS

International Search Report and Written Opinion for PCT/DE2007/000046 dated Sep. 11, 2007.

(Continued)

*Primary Examiner*—Patricia Nguyen
(74) *Attorney, Agent, or Firm*—Henry B. Ward, III; Moore & Van Allen, PLLC (57) ABSTRACT

The invention relates to a circuit for adjusting an impedance between two terminals, said impendance including the input impedance of the circuit. The aim of the invention is to enlarge the adjustment range and to stabilize—the operating behavior of such a circuit. For this purpose, the circuit comprises amplifiers, adjusting means with which amplification of at least one amplifier and/or the circuit can be changed in general and the impedance between the two terminals can be modified by influencing the one or more adjusting means.

19 Claims, 8 Drawing Sheets

U.S. PATENT DOCUMENTS 6,906,584 B1 * 6/2005 Moffat et al. .................. 330/69

FOREIGN PATENT DOCUMENTS

| DE | 3151082 | 7/1983 |
| --- | --- | --- |
| DE | 3711320 | 8/1988 |
| DE | 3901314 | 7/1990 |
| DE | 4327712 | 2/1995 |
| DE | 102004047116 | 10/2005 |
| EP | 0564164 | 10/1993 |
| EP | 0656542 | 6/1995 |
| JP | 60259014 | 12/1985 |
| JP | 60261209 | 12/1985 |
| WO | WO 90/12274 | 10/1990 |

OTHER PUBLICATIONS

International Preliminary Report on Patentability for PCT/DE2007/000046 dated Sep. 18, 2008.

* cited by examiner

CIRCUIT FOR ADJUSTING AN IMPEDANCE

The invention relates to a circuit for adjusting an impedance between two poles, wherein the impedance comprises the input impedance of the circuit.

Adjustable impedances are required and used in many areas of circuit engineering. They are employed particularly frequently in connection with customizable LC resonant circuits and are used to tune the resonant circuit to a desired resonant frequency. The resonant frequency of an LC resonant circuit is determined by its capacitance and inductance values. If the resonant frequency needs to be adjusted or altered, these values need to be influenced in a suitable manner. Various methods are known for this from practice. Firstly, fixed capacitance and inductances can be switched in or out for the resonant circuit. Secondly, trimming or variable capacitors and adjustable-inductance coils are known and have been used for many years. Another option for adjusting impedances is provided by variable capacitance diodes.

Such approaches are problematical when the resonant circuit needs to be adjusted or trimmed automatically. Although it is conceivable to loop in or isolate individual fixed capacitors or inductances into/from the resonant circuit using electronic switches, this means that only a small number of discrete frequency values can be set. In addition, component tolerances mean that the frequencies can be adjusted comparatively inaccurately. Although trimming or variable capacitors and adjustable-inductance coils provide continuous and large ranges of adjustment, the mechanical movement or rotation required means that they are totally unsuitable for automatic trimming. Although the capacitance of variable capacitance diodes can be adjusted automatically and virtually continuously, it has a high level of nonlinear dependency on the control voltage and exhibits a high level of temperature drift and dependency on the resonant circuit amplitude. Furthermore, easily controlled and stable components which can be adjusted over a relatively wide range are little known. Although available programmable capacitances are easily controlled and have sufficient stability, their range of adjustment is merely a few picofarads. These or similar problems not only arise when changing the resonant frequency of resonant circuits but are likewise known from other areas of application in which variable impedances are used.

The present invention is therefore based on the object of designing and developing a circuit of the type cited at the outset such that it is possible to achieve the widest possible range of adjustment for an impedance with good controllability and/or programmability at the same time. In this context, the circuit must be able to be of simple and inexpensive design and needs to have the most stable operating behavior possible.

The invention achieves the above object by means of the features of patent claim 1. Accordingly, the circuit in question is characterized in that the circuit comprises amplifiers, in that adjusting means are present which can be used to alter the gain of at least one amplifier and/or the circuit as a whole, and in that influencing the adjusting means allows the impedance between the two poles to be altered.

The invention has first of all recognized that adjusting an impedance between two poles does not just involve adjustability being able to be achieved by switching impedances in or out or adjusting their values. Rather, the impedance between two poles can be altered as an input impedance for a circuit using electronic means. To this end, the invention involves the use of amplifiers in the circuit, with one or more of the amplifiers being able to have their gain adjusted by adjusting means. Alternatively or in addition, the gain of the whole circuit could also be variable. Influencing the adjusting means alters the impedance between the two poles, which can be used to allow an impedance between the two input poles to be adjusted given suitable dimensioning of the amplifiers and their circuitry. Suitable configuration of the adjusting means allows an impedance to be altered over a wide range in this manner using simple means. The use of amplifiers and simple adjusting means therefore allows an impedance to be adjusted over a relatively wide range and allows good controllability and programmability to be achieved.

It would also be possible to use electronically adjustable adjusting means, which allows automatic adjustment.

Advantageously, the gain is chosen to have a value between 0 and 1. Although a value greater than 1 could also be set, the circuit then tends to produce oscillations, which are generally undesirable.

Preferably, the amplifiers are implemented by operational amplifiers. Operational amplifiers have the advantage that they can be used to construct compact circuits comparatively easily. However, particularly at relatively high frequencies, it would also be possible to use other amplifiers, such as simple transistor amplifiers.

One pole or both poles of the circuit has/have a respective amplifier which acts as a buffer amplifier. This buffer amplifier is used to make the input potential on the pole independent of the output. If the potential applied to a pole is at fixed potential, it is generally possible to dispense with the use of a buffer amplifier. In general, however, at least one of the poles will have a buffer amplifier.

In addition, the circuit contains a feedback loop which contains a feedback impedance. This feedback impedance could be formed from one or more capacitances and/or one or more inductances. In addition, resistive components could be included. The feedback impedance could be designed in a wide variety of ways. All impedances known from practice are available for this. Foil capacitors, core coils, multilayer capacitors or ceramic capacitors are mentioned just as a few exemplary embodiments. The impedance could also be implemented as part of an integrated circuit, however. The choice of components will in most cases depend on the respective circuitry requirements.

Advantageously, the feedback impedance, the amplifiers and the adjusting means could interact such that influencing the adjusting means allows that part of the feedback impedance which is effective for the input impedance of the circuit to be adjusted. This could be in a form such that as the gain increases the effective component of the feedback impedance decreases. If a gain factor of 1 were to be chosen in such a circuit, the feedback impedance would be ineffective. The greater the decrease in the gain factor, the larger the effective component of the feedback impedance would become. If a gain factor of 0 were reached, the whole feedback impedance would take effect at the input of the circuit.

The adjusting means could be manually, electrically, electronically and/or digitally adjustable. Manual adjustability may be of interest particularly when adjusting electronics are to be or can be dispensed with and the impedance needs to be altered only comparatively rarely. Electrical, electronic or digital adjustability is necessary particularly when the impedance is adjusted automatically or in automated fashion. These adjusting means may be implemented by all apparatuses which are known from practice. Depending on the desired area of application and the desired adjustment accuracy, the adjusting means may have continuous adjustability or be able to be altered in stages or quasi-continuously. Which adjusting means are ultimately chosen is dependent on the respective desired field of use and the attendant requirements.

One possible refinement of the adjusting means would be when potentiometers are used. These could be configured in the widest variety of manners known from practice. Either analog or digital configuration would be conceivable in this context.

Another option for implementing an adjusting means would be for an adjusting means to be realized with an associated amplifier as a current or voltage controlled amplifier. A current controlled amplifier (IGA) would be adjusted using an adjustable current source. Accordingly, a controllable voltage source would be provided for adjusting a voltage controlled amplifier (VGA). The current or voltage source could in turn be adjusted in the widest variety of manners known from practice. Thus, the current or voltage source could be in the form of a digitally controlled or analog-controlled source.

However, an adjusting means could also be formed by a multiplying digital/analog converter. In this case, the multiplication factor could be input into the system as a digital variable, for example, and the input variable could be multiplied by this factor.

In addition, many other adjusting means are conceivable. A multiplicity of options are known for this purpose from practice.

In addition, various adjusting means could be combined with one another in various ways. Thus, by way of example, an adjusting means could be provided which can be used to adjust the gain in a coarse range. A further adjusting means could be provided for adjusting the fine range. It would also be possible to use different types of adjusting means in this context. By way of example, the coarse range could be adjusted manually while fine tuning is performed electronically.

For the purpose of adjusting the impedance preferably automatically, an adjusting device could be provided which outputs control signals to the adjusting means. These control signals could firstly be in the form of analog control voltages or currents, and secondly the control signals could comprise digital signals. In this case too, the widest variety of methods known from practice may again be used. The choice of the control signals and the choice of the adjusting means will be tuned to one another as appropriate, however.

Preferably, an adjusting device operates essentially automatically. This allows the circuit to adjust the desired impedance or the desired response automatically. The adjusting process could firstly take place in the form of a control operation. In this case, a desired impedance will be prescribed, for example, and the adjusting device would adjust the adjusting means accordingly. The correspondence between the prescribed value and the actual setting of the adjusting means could firstly be prescribed by the circuit itself. Secondly, particularly in the case of digital control, the association could be in the form of an association specification, for example in the form of an association table. In this context, the desired value could also be prescribed indirectly. If the circuit were used in an LC resonant circuit, for example, a desired frequency could be prescribed. This frequency would then be assigned an appropriate setting of the adjusting means.

Often, automated adjustment is much simpler and more precise if the adjustment is made in the form of a closed-loop control operation, however. In this case, if the circuit were used in an LC resonant circuit, for example, the frequency which is output by the resonant circuit could be measured and compared with a prescribed nominal frequency. The adjusting device then customizes the adjusting means in suitable fashion until the difference between the desired frequency and the actually output frequency is below a prescribable limit.

The circuit can advantageously be used in connection with customization of the resonant frequency of a resonant circuit. This affords the particular advantages in connection with the actuation of a sensor, for example. If the sensor is an eddy current sensor, for example, which is intended to be operated at a resonant frequency, the inventive circuit can advantageously be used to adjust the driver circuit to the resonance of the sensor. This would allow very simple and rapid reaction to changes in the resonant frequency as a result of temperature drift, component aging, corrosion, disturbance variables or the like.

Secondly, the inventive circuit could also be used in connection with the customization of an output of a driver circuit. Signals can then be input into a cable particularly effectively if the output impedance of the driver stage essentially corresponds to the impedance of the connected cable. This is not a difficulty with cables which are permanently connected to the output of the driver circuit, since in this case the suitable terminating impedances can be well-defined and added at suitable points. If various lengths of cable can be connected to a driver circuit, however, the impedance of the output stage would need to be matched to the respective cable used. In this context, it would be possible to use the inventive circuit.

Furthermore, many other fields of use for the inventive circuit are conceivable.

There are now various ways of advantageously refining and developing the teaching of the present invention. In this respect, reference can be made firstly to the patent claims which are subordinate to patent claim 1 and secondly to the explanation which follows for preferred exemplary embodiments of the invention with reference to the drawing. In conjunction with the explanation of the preferred exemplary embodiments of the invention with reference to the drawing, generally preferred refinements and developments of the teaching are also explained. In the drawing—in each case as a block diagram—

Figure 1:
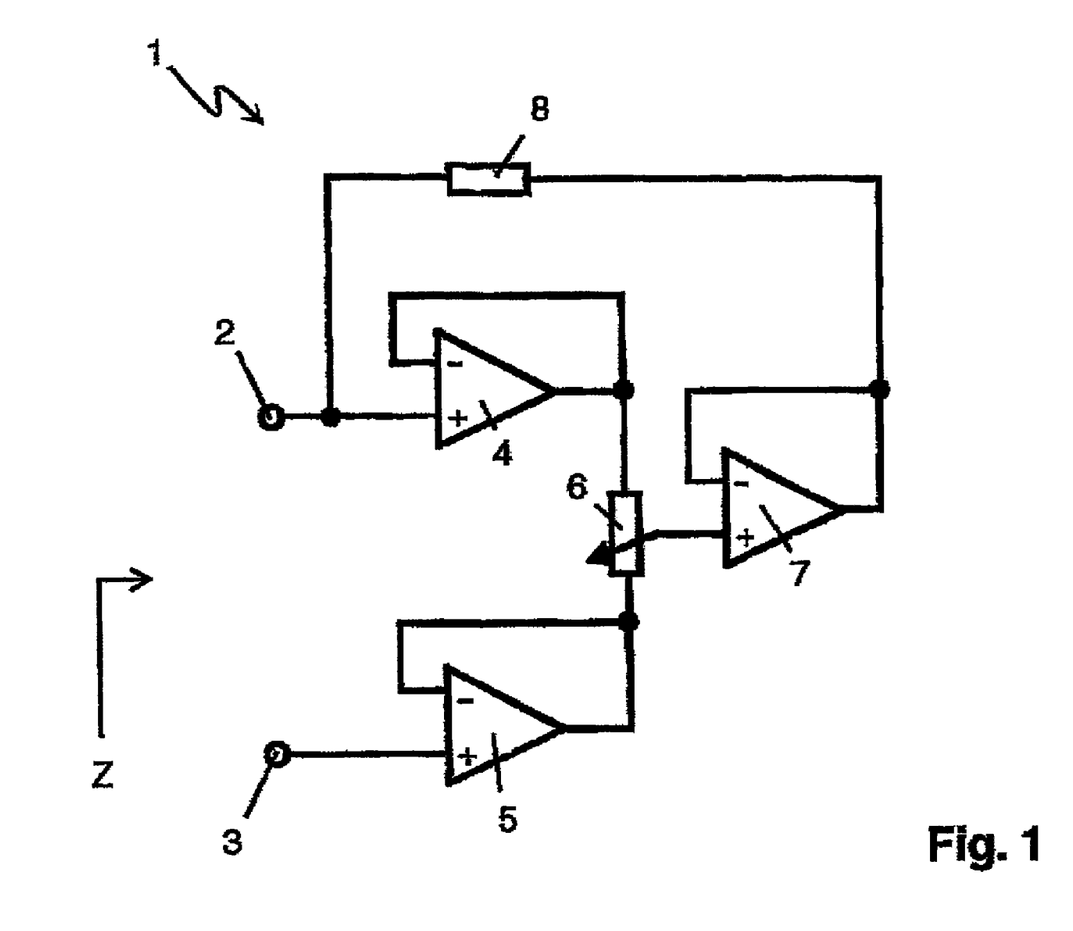
FIG. 1 shows the basic design of a circuit based on the invention for adjusting the impedance between two poles with a buffer amplifier at each pole.
Figure 2:
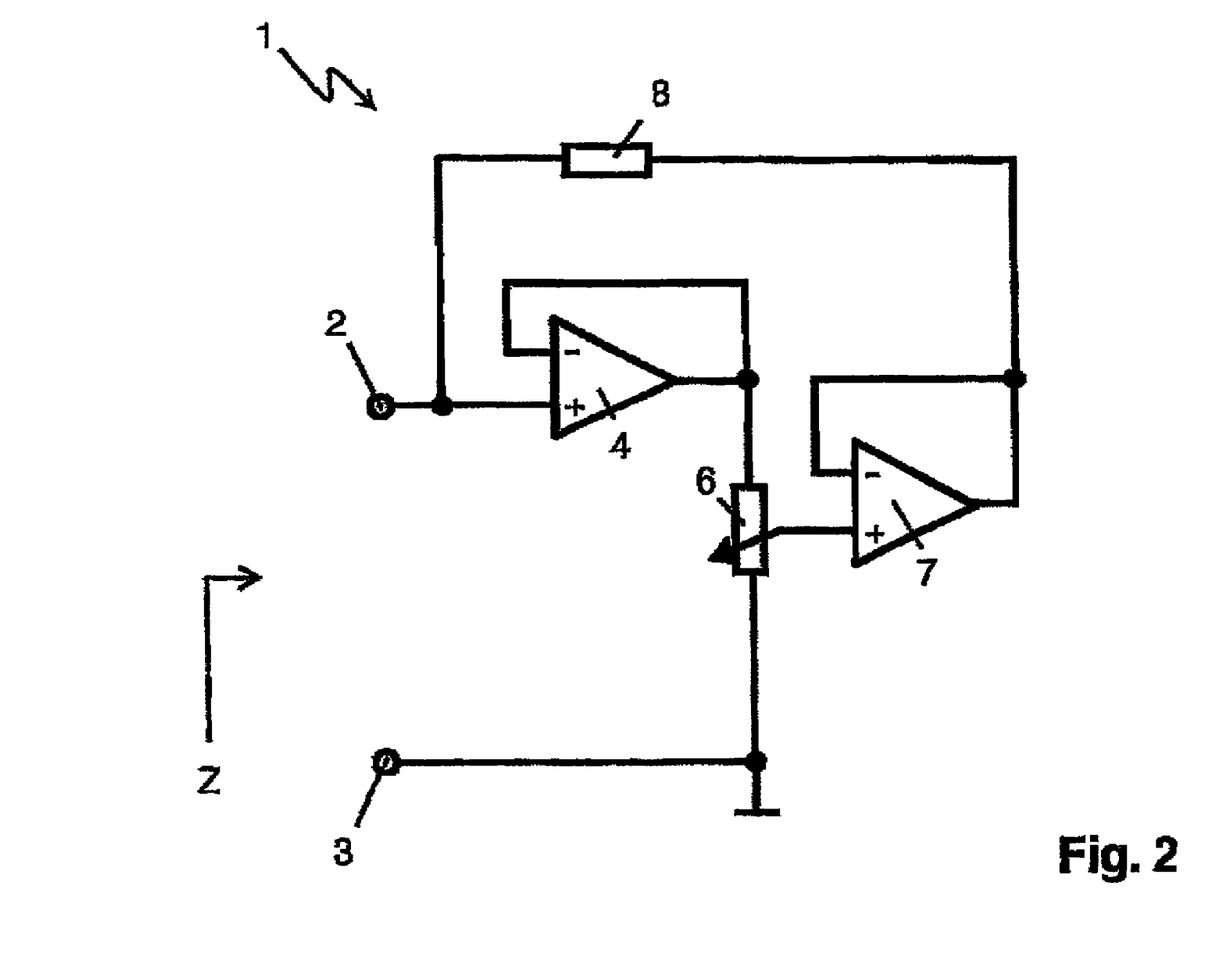
FIG. 2 shows the basic design of a circuit based on the invention which is similar to that in FIG. 1, where just one pole has a buffer amplifier.

FIGS. 1 and 2 show the basic design of a circuit 1 based on the invention for adjusting the impedance Z between two poles 2, 3. Each of the poles 2, 3 is connected to a respective buffer amplifier 4 or 5 in FIG. 1, which are connected up as impedance converters. In FIG. 2, only one buffer amplifier 4 is provided, while a signal which is input into pole 3 is fed directly into the circuit. Since pole 3 is at ground potential, the buffer amplifier can be dispensed with. The outputs of the buffer amplifiers or the directly connected pole are connected to a potentiometer 6 in FIGS. 1 and 2 such that the rated resistance of the potentiometer 6 lies between the two connections. The loop contact of the potentiometer 6 is connected to the noninverting input of an operational amplifier 7. In all the operational amplifiers 4, 5, 7 used, the output is in each case fed back directly to the inverting input. The output of the operational amplifier 7 is additionally connected to the pole 2 via a feedback impedance 8. Depending on the setting of the potentiometer 6, the gain of the circuit 1 is set between 0 and 1. The general tendency to oscillation means that gains of greater than 1 are not appropriate. By altering the gain, different-sized components of the feedback impedance 8 become effective for the impedance Z. With a gain close to 1, the impedance Z can be adjusted to a minimum value— ideally close to 0—and with a gain of approximately 0, it can be adjusted approximately to the value of the feedback impedance 8. Since a potentiometer 6 is used in the embodiment shown and the gain can be adjusted continuously, the impedance is also able to be adjusted in a continuous range of values.

Figure 3:
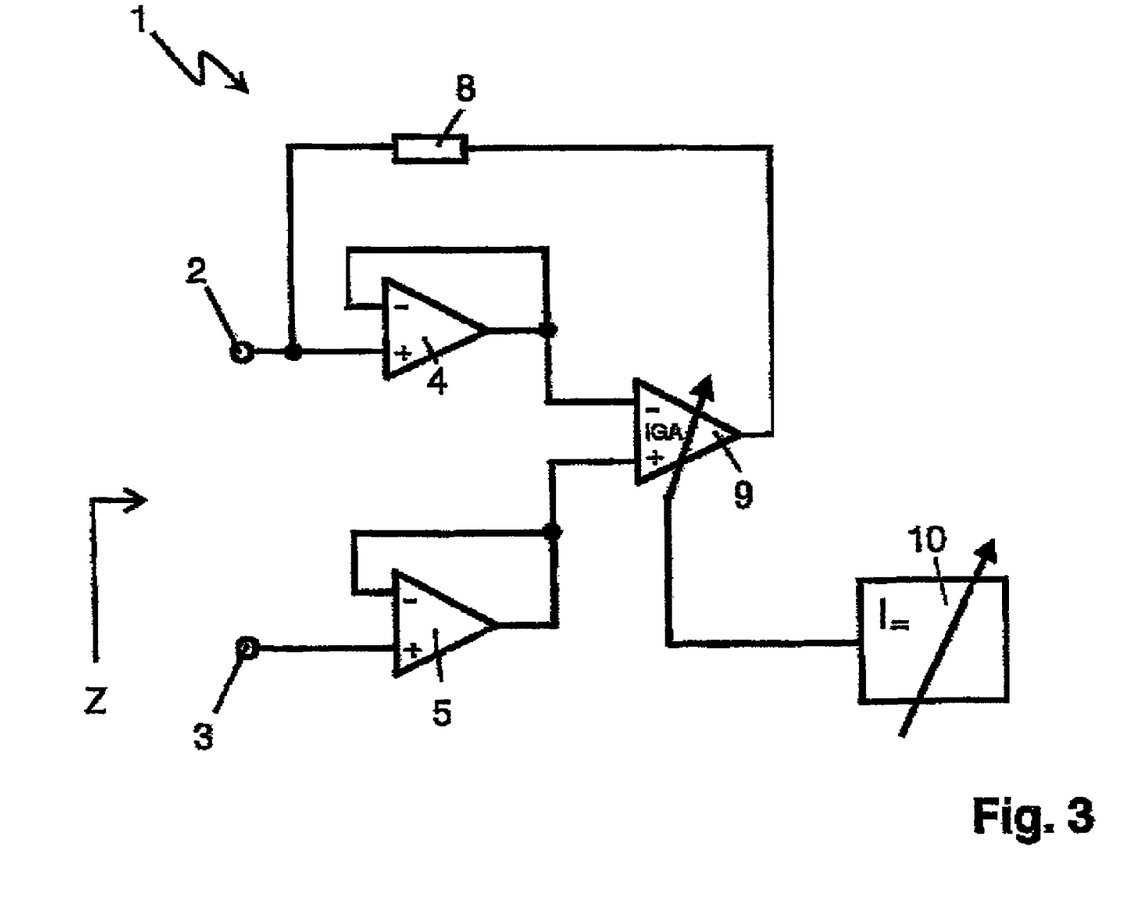
FIG. 3 shows the use of a voltage controlled amplifier in a circuit based on the invention.

FIG. 3 shows a comparable design to that in FIG. 1. The only difference is that in this case the potentiometer 6 and the subsequent amplifier 7 are replaced by a current controlled operational amplifier 9 (IGA). The control current is produced by a controllable current source 10. In this arrangement, the current source 10 may be in manually, electrically, electronically or digitally adjustable form.

Figure 4:
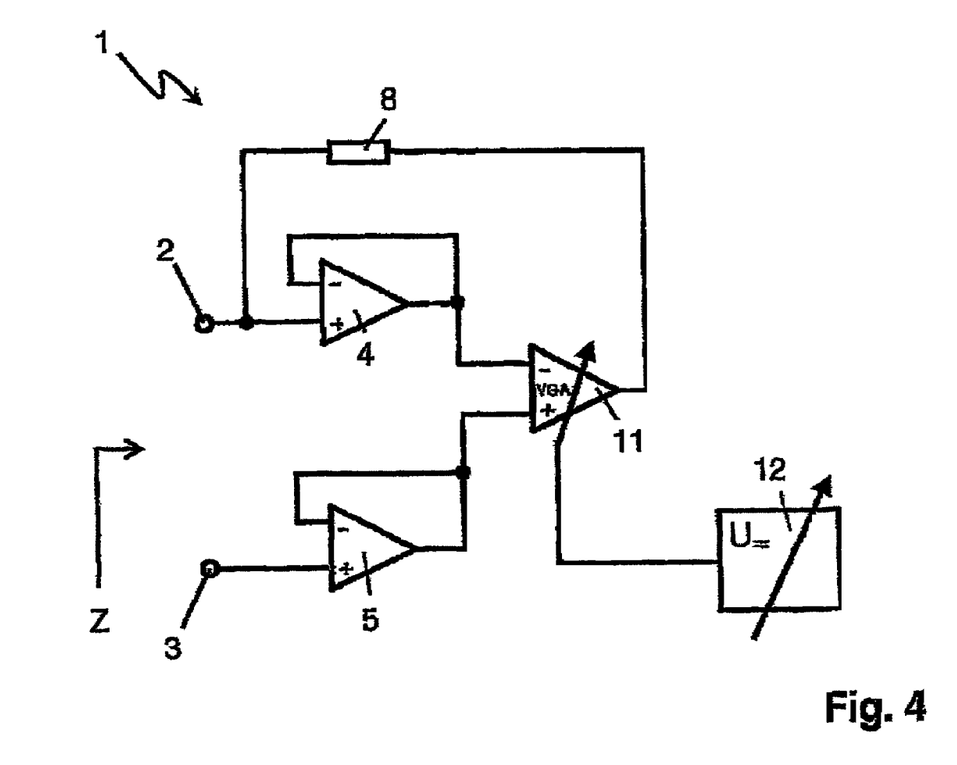
FIG. 4 shows the use of a current controlled amplifier in a circuit based on the invention.

FIG. 4 shows the use of a voltage controlled amplifier 11 (VGA). In this context, the control signal forms the output voltage from an adjustable voltage source 12. This source may also be adjustable in a wide variety of ways.

Figure 5:
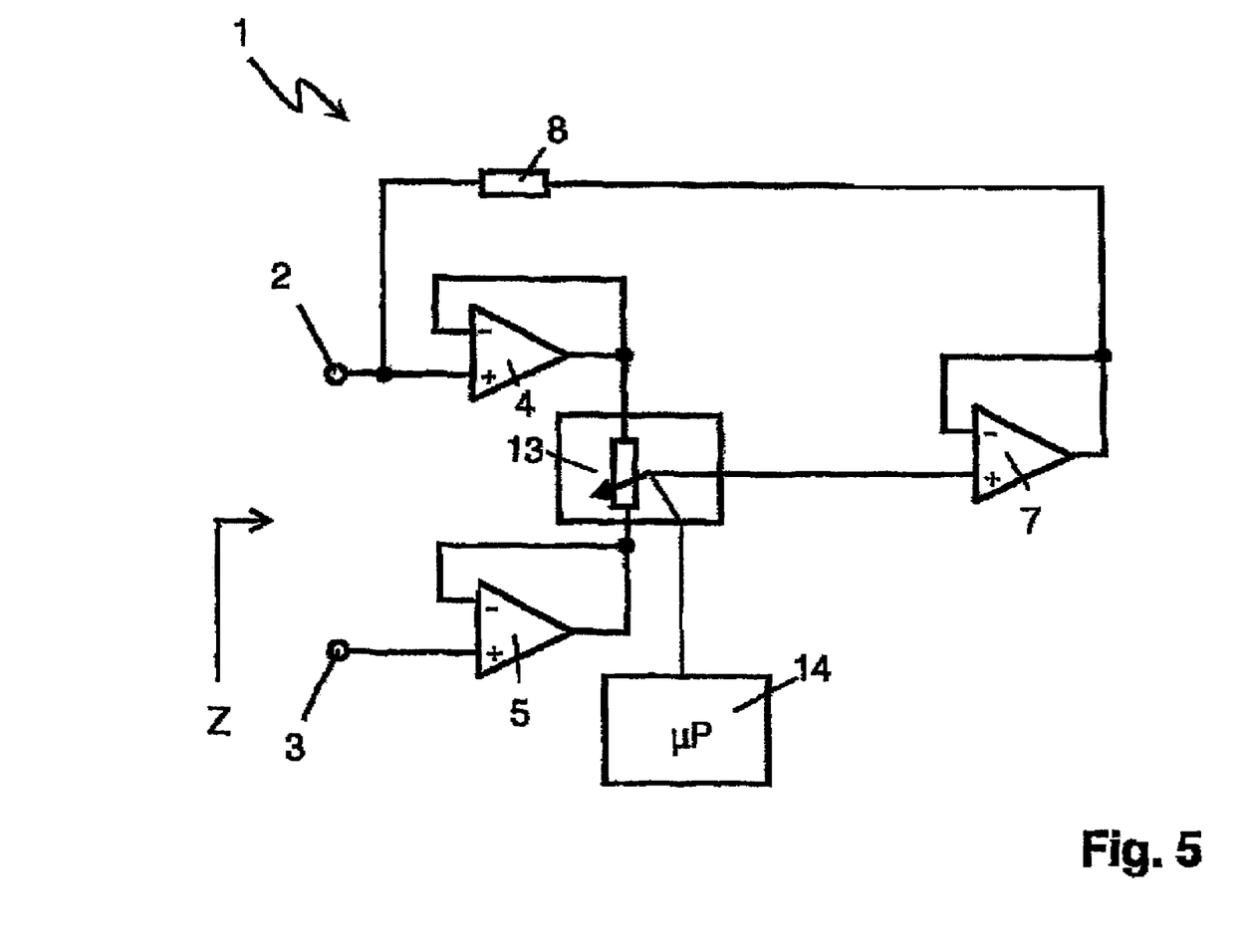
FIG. 5 shows the adjusting means in the form of a digital potentiometer.

FIG. 5 shows another refinement of the adjusting means. The design of the circuit 1 is the same, in principle, as that of the circuit from FIG. 1. The only difference is that the potentiometer 6 is replaced by a digital potentiometer 13, which is adjusted by a microprocessor 14 using a digital control signal.

Figure 6:
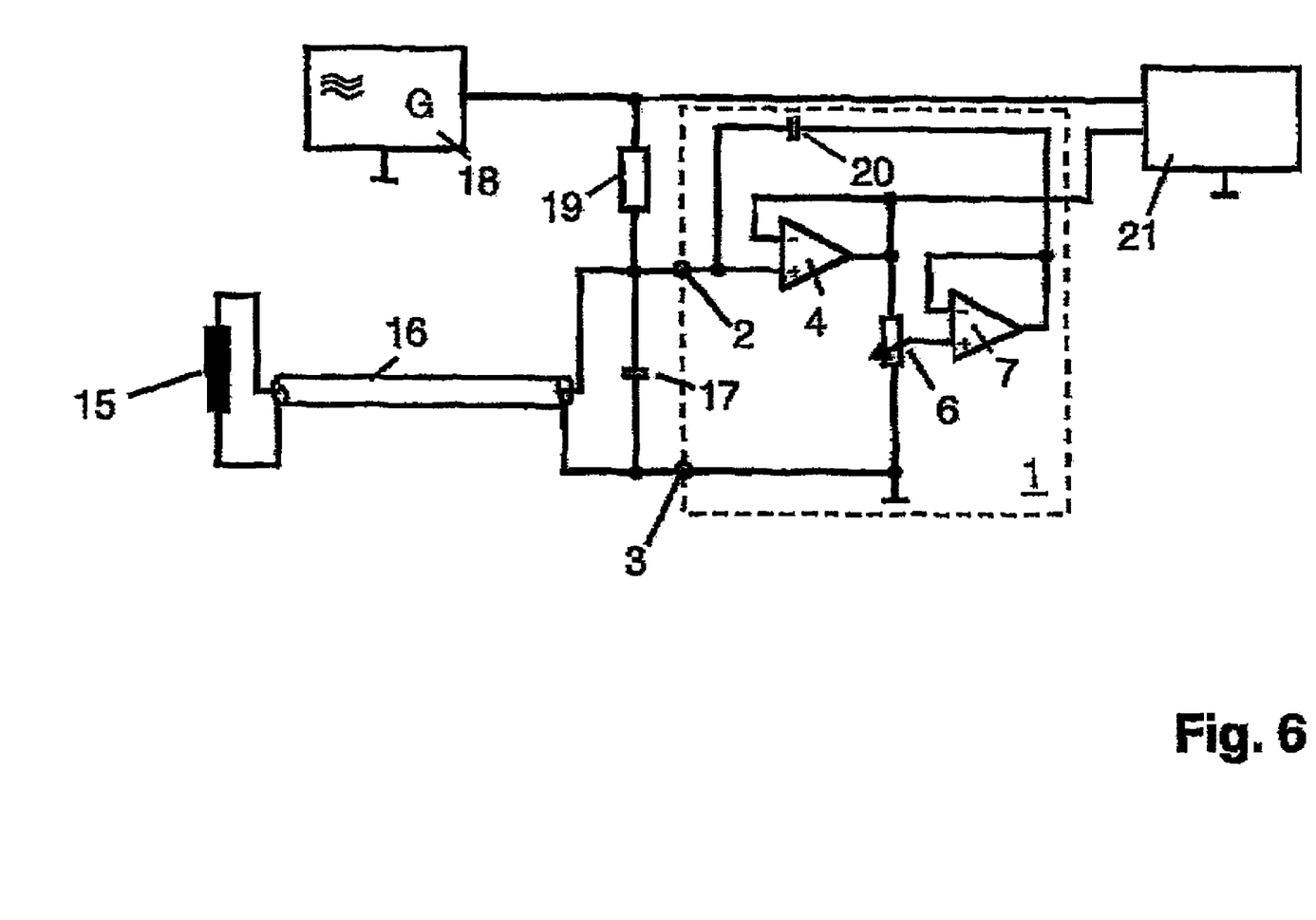
FIG. 6 shows the use of a circuit based on the invention in connection with the actuation of an eddy current sensor.
Figure 7:
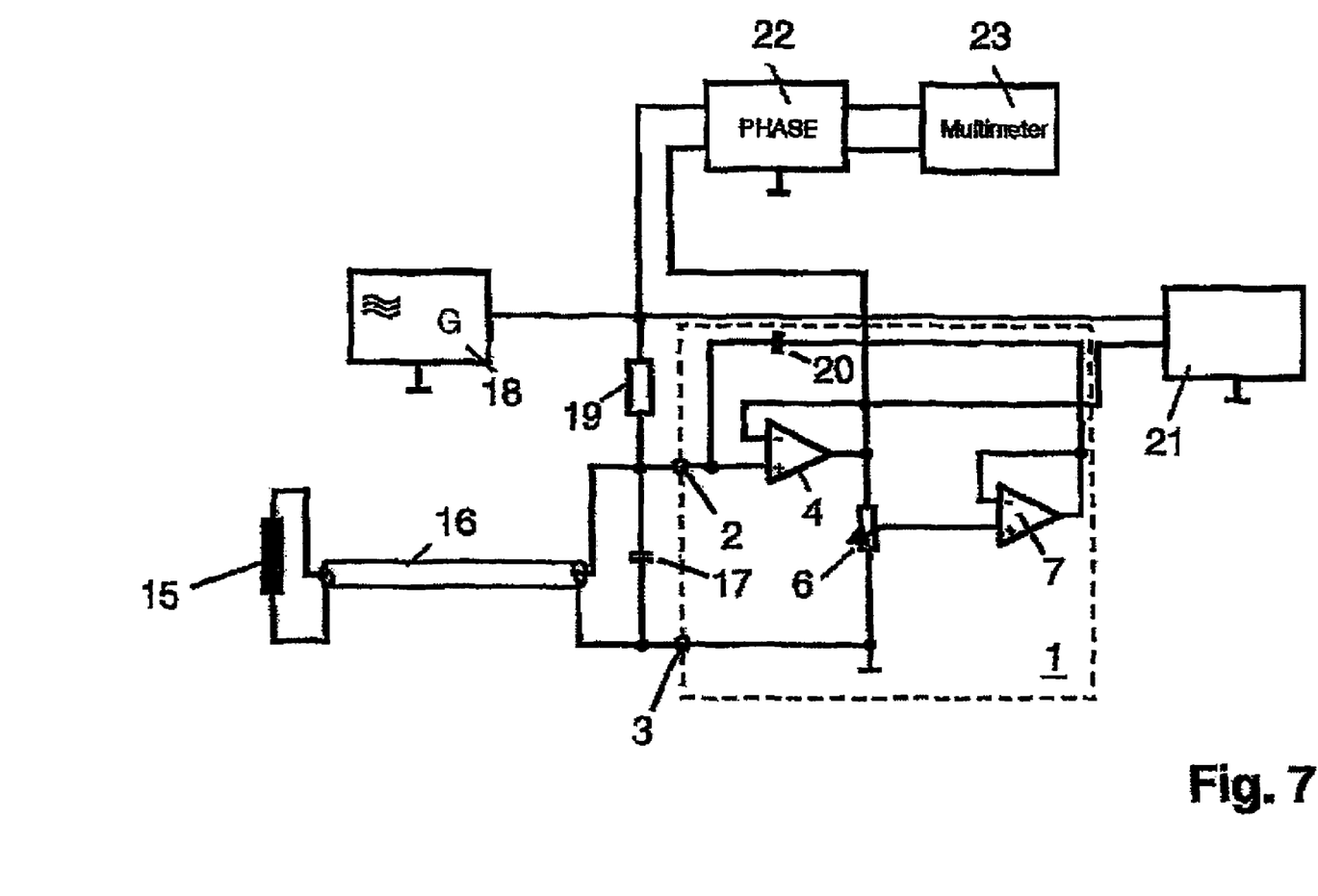
FIG. 7 shows the use of a circuit based on the invention as shown in FIG. 6, where the circuit additionally comprises a detection apparatus.
Figure 8:
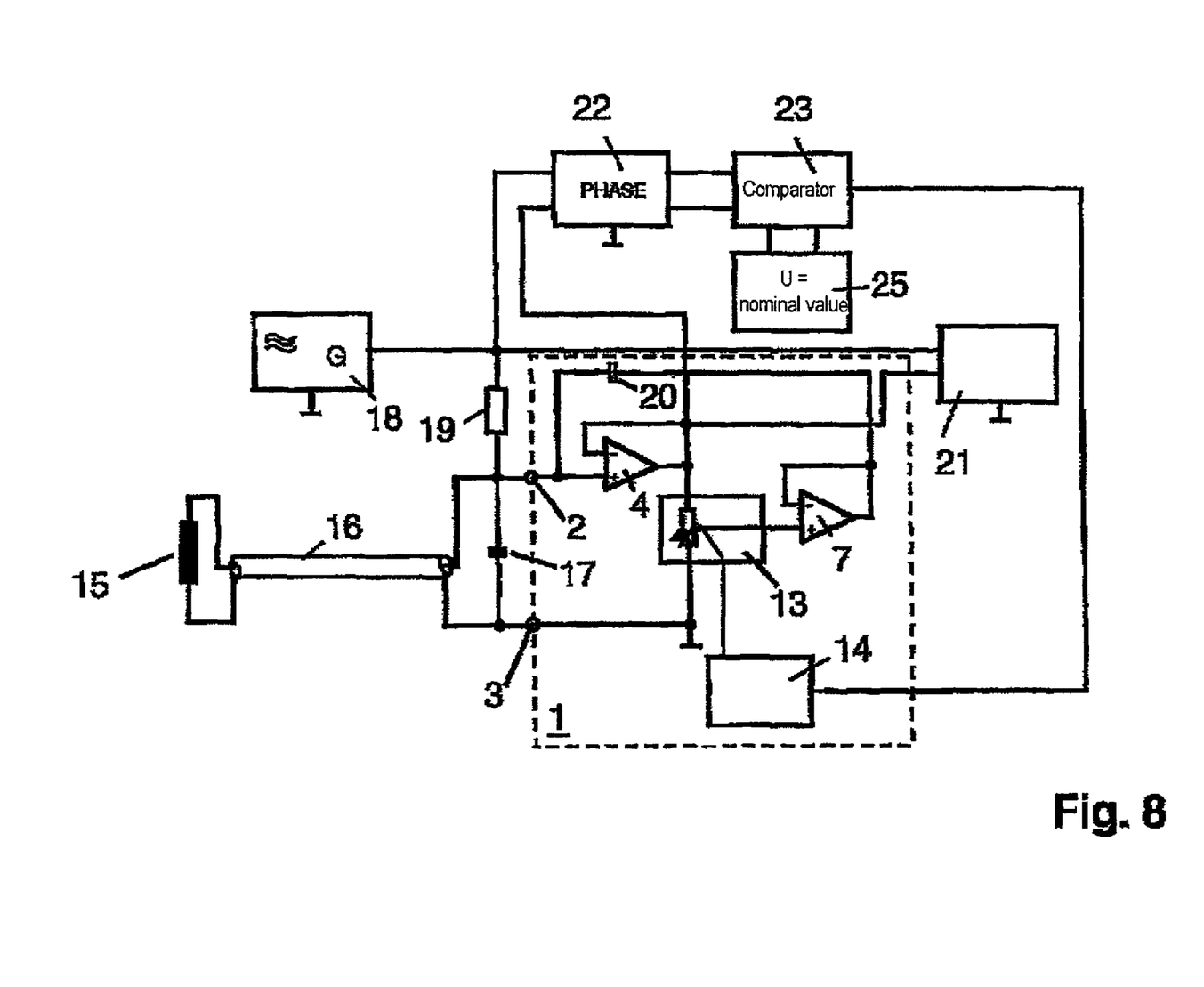
FIG. 8 shows the use of a circuit based on the invention as shown in FIG. 7, where the circuit is in automatically adjustable form.

FIGS. 6, 7 and 8 show the use of a circuit 1 based on the invention in connection with the actuation of a sensor 15. The sensor 15 shown is meant to be part of a displacement measuring system which operates on the basis of the eddy current loss principle. This sensor 15 is supposed to operate at a resonant frequency and to be kept at this frequency, so that conductive objects entering the measuring range of the eddy current sensor 15 produce a particularly large influence on the measurement signal. To this end, the eddy current sensor 15 together with its connecting cable 16 is complemented by a capacitor 17 to form a resonant circuit, which has trimmed beforehand to a fundamental frequency by the choice of values for the components. The resonant circuit is supplied with power by a generator 18, the power being input into the resonant circuit via a coupling impedance 19. Connected in parallel with the capacitance 17 is a circuit 1 based on the invention for adjusting an impedance Z between two poles 2, 3. Since the pole 3 is at ground potential, a buffer amplifier at this pole is dispensed with. The circuit 1 used is thus the same as the circuit shown in FIG. 2. The feedback impedance is formed by a capacitance 20.

Adjusting the potentiometer 6 adjusts the gain of the circuit 1 and hence that component of the feedback capacitance 20 which is effective for the impedance Z. This allows the total capacitance of the parallel circuit comprising the capacitance 17 and the circuit 1 to be altered. The change in the total capacitance is also accompanied by a change in the resonant frequency of the resonant circuit comprising proximity sensor 15, cable 16, capacitance 17 and circuit 1. At a gain close to 1, a minimum portion of the feedback impedance 20 becomes effective. Since the frequency of a resonant circuit is inversely proportional to the root of the capacitance, a maximum resonant frequency will be obtained for a minimum capacitance. As the gain decreases, that portion of the feedback capacitance 20 which is effective for the impedance Z increases. This reduces the resonant frequency of the resonant circuit to a minimum. Suitable choice of the individual components therefore allows the resonant frequency to be shifted in a wider range.

When the circuit has been adjusted, the signal detected by the sensor 15 is evaluated as appropriate by evaluation electronics 21 according to the measurement-related requirements.

The circuit shown in FIG. 7 differs from the circuit shown in FIG. 6 in that the phase difference is determined between the signal output by the generator 18 and the signal from the resonant circuit comprising proximity sensor 15, connecting cable 16, capacitance 17 and circuit 1. The phase difference determined via the phase comparator 22 is output by a display device 23, which in this case is in the form of a multimeter. This phase difference can be used to customize the adjusting means 6 until the difference is below a prescribable limit, for example close to 0. In FIG. 7, the adjusting means is adjusted manually.

FIG. 8 shows a circuit in which this customization can be performed in an automated fashion. In this context, the circuit 1 is formed by the circuit shown in FIG. 5, and again the buffer amplifier 5 is dispensed with for the reason which is known. The feedback impedance used is a capacitance 20. A phase comparator 22 measures the phase difference between the signal generated by the generator 18 and the signal from the resonant circuit comprising proximity sensor 15, connecting cable 16, capacitance 17 and circuit 1. The output of the phase comparator 22 is routed to a further comparator 24, which compares the difference signal with a nominal value 25. This nominal value 25 will generally correspond to a phase difference of 0. However, other nominal values are also conceivable. The output of the comparator 24 is made available to a microprocessor 14 as input signal. On the basis of the result of the comparison between the phase difference and the nominal value, the microprocessor 14 adjusts the digital potentiometer 13 in suitable fashion, so that the difference signal received by the comparator 24 ends up below a prescribable threshold.

However, the circuits shown in FIGS. 6, 7 and 8 may also be used to allow the use of different lengths of connecting cables. Previously existing displacement measuring systems operating on the basis of the eddy current loss principle have the problem that the cable length between the sensor and the associated electronics is limited. The reason for this is, in particular, that for a given operating frequency the cable capacitance in conjunction with the inductance of the cable itself and the inductance of the sensor can only assume a maximum value. The maximum permissible cable length is reached when the total parallel capacitance required is contained in the cable. If the length which is then reached is not sufficient for the application, an additional parallel inductance can reduce the total inductance and hence increase the resonant frequency of the resonant circuit. This allows the sensor cable to be extended further in order to obtain the desired resonant frequency again.

For this, it is again possible to use a circuit based on the invention. The whole circuit for actuating the sensor corresponds to the circuits shown in FIGS. 6, 7 and 8. Only the feedback capacitance 20 in the circuits needs to be replaced by a feedback inductance. The resonant circuit again comprises the sensor, the capacitive and inductive contribution of the connecting cable 16, the capacitance 17 and the impedance formed by the circuit 1. Altering the gain of the circuit 1 allows the impedance Z to be altered. At a gain close to 1, a minimum portion of the feedback inductance is effective, which means that the resonant circuit assumes a minimum resonant frequency. Reducing the gain allows the portion of the feedback inductance which is effective for the impedance Z to be increased, as a result of which the resonant frequency of the resonant circuit is increased to its maximum. This allows basic fitting with a capacitance 17, which is necessary for the correct resonant frequency without a sensor cable 16, for example, and again allows manual or automatic trimming to the correct resonant frequency by adjusting the circuit 1, depending on the length of the connected sensor cable 16.

In addition, both a circuit 1 having a feedback capacitance and a circuit 1 having a feedback inductance could be provided. This allows the resonance to be shifted upward or downward depending on the actuation of the circuits.

Finally, it should be emphasized quite particularly that the exemplary embodiments explained above serve merely to explain the claimed teaching, but said teaching is not intended to involve any restriction to the exemplary embodiments.

The invention claimed:

1. A circuit for adjusting an impedance between two poles, wherein the impedance comprises an input impedance of the circuit, wherein the circuit comprises:
    at least one amplifier; and an adjusting mechanism, wherein said adjusting mechanism is configured such that it can be used to alter the gain of at least one of the said at least one amplifier or the circuit, and wherein influencing the adjusting mechanism allows the impedance between the two poles to be altered;
    a feedback loop comprising a feedback impedance, said feedback impedance comprising at least one of a capacitance or an inductance.

2. The circuit as claimed in claim 1, wherein the gain is chosen between 0 and 1.

3. The circuit as claimed in claim 1, wherein said at least one amplifier comprises an operational amplifier.

4. The circuit as claimed in claim 1, wherein at least one of the two poles bears said at least one amplifier as a buffer amplifier.

5. The circuit as claimed in claim 4, wherein no buffer amplifier is provided if the potential applied to the relevant pole is a fixed potential.

6. The circuit as claimed in claim 1, wherein said feedback impedance comprises a component which is effective for the input impedance of the circuit and wherein said adjusting mechanism allows said component to be adjusted.

7. The circuit as claimed in claim 1, wherein said adjusting mechanism is at least one of manually, electronically or digitally adjustable.

8. The circuit as claimed in claim 1, wherein said adjusting mechanism can be adjusted such that the gain changes at least one of continuously or in stages.

9. The circuit as claimed in claim 1, wherein said adjusting mechanism comprises a potentiometer.

10. The circuit as claimed in claim 1, further comprising an associated amplifier associated with said adjusting mechanism, wherein said adjusting mechanism together with said associated amplifier comprise one of a current controlled amplifier or a voltage controlled amplifier.

11. The circuit as claimed in claim 1, wherein said adjusting mechanism is in the form of a multiplying digital/analog converter.

12. The circuit as claimed in claim 1, further comprising an adjusting device, wherein said adjusting device outputs control signals for said adjusting mechanism.

13. The circuit as claimed in claim 12, wherein said adjusting device adjusts said adjusting mechanism automatically.

14. The circuit as claimed in claim 12, wherein said adjusting device comprises a closed-loop controller.

15. The circuit as claimed in claim 12, wherein said adjusting device adjusts a desired input impedance for the circuit.

16. The circuit as claimed in claim 1, further comprising a sensor, wherein the circuit is used for customizing the resonant frequency of a resonant circuit in connection with the actuation of said sensor.

17. The circuit as claimed in claim 16, wherein said sensor comprises an eddy current range finder.

18. The circuit as claimed in claim 1, further comprising a driver circuit having an output, and wherein the circuit is used for matching said output to different impedances connected to said output.

19. The circuit as claimed in claim 18, further comprising a sensor and two or more different lengths of cable, wherein the different impedances connected to the output of the driver circuit are brought about by said two or more different lengths of cable connected to said sensor.

\* \* \* \* \*